US007862230B2

(12) United States Patent
Borgmann et al.

(10) Patent No.: US 7,862,230 B2
(45) Date of Patent: Jan. 4, 2011

(54) METHOD AND DEVICE FOR CONTROLLING AN INTERNAL COMBUSTION ENGINE

(75) Inventors: Christian Borgmann, Lappersdorf (DE); Manfred Klepatsch, Pettndorf (DE); Stephan Wenzel, München (DE)

(73) Assignee: Continental Automotive GmbH, Hannover (DE)

(*) Notice: Subject to any disclaimer, the term of this patent is extended or adjusted under 35 U.S.C. 154(b) by 520 days.

(21) Appl. No.: 12/040,080

(22) Filed: Feb. 29, 2008

(65) Prior Publication Data

US 2008/0240200 A1 Oct. 2, 2008

(30) Foreign Application Priority Data

Mar. 9, 2007 (DE) ....................... 10 2007 011 693

(51) Int. Cl.
*G01M 15/04* (2006.01)
*H01L 41/00* (2006.01)

(52) U.S. Cl. ....................... 374/141; 374/117; 374/184; 73/114.01; 123/478; 324/378

(58) Field of Classification Search ..................... 374/1, 374/141, 144, 163, 183, 184, 117–119, 100, 374/E13.009; 73/114.77, 114.01, 118.01, 73/118.02, 116.01, 116.02; 324/378, 384, 324/382; 310/316.03, 317; 239/585.1, 585.5; 123/490, 498, 472, 478
See application file for complete search history.

(56) References Cited

U.S. PATENT DOCUMENTS

| | | | | |
|---|---|---|---|---|
| 6,133,714 | A * | 10/2000 | Hoffmann et al. | 320/166 |
| 6,157,174 | A | 12/2000 | Hoffmann et al. | 320/166 |
| 6,236,190 | B1 * | 5/2001 | Hoffmann et al. | 320/166 |
| 6,539,925 | B2 * | 4/2003 | Rueger et al. | 123/490 |
| 6,619,268 | B2 * | 9/2003 | Rueger et al. | 123/490 |
| 6,766,791 | B2 | 7/2004 | Bock et al. | 123/498 |
| 6,895,940 | B2 * | 5/2005 | Igashira | 123/472 |
| 2008/0053410 | A1 * | 3/2008 | Gant | 123/472 |

FOREIGN PATENT DOCUMENTS

| | | | |
|---|---|---|---|
| DE | 199 31 233 | A1 | 1/2001 |
| DE | 100 63 080 | A1 | 7/2002 |
| DE | 103 28 788 | A1 | 1/2005 |
| DE | 10 2005 010 028 | A1 | 9/2006 |
| DE | 102005015731 | A1 * | 10/2006 |
| DE | 10 2005 025 415 | A1 | 12/2006 |
| DE | 196 52 807 | A1 | 6/2008 |
| DE | 102009027101 | A1 * | 12/2009 |

* cited by examiner

*Primary Examiner*—Gail Verbitsky
(74) *Attorney, Agent, or Firm*—King & Spalding L.L.P.

(57) ABSTRACT

On the fulfillment of a specified condition, a temperature signal outside an actuating device is detected to which a piezoelectric actuator is assigned. A piezoelectric temperature value is determined by the temperature signal. A temperature-capacitance characteristic value of the piezoelectric actuator is determined by the piezoelectric temperature value through specified mapping. A measured capacitance characteristic value is determined by a detected piezoelectric actuator charge and voltage corresponding to the temperature signal. A first correction capacitance characteristic value is determined by the measured capacitance characteristic value and the temperature-capacitance characteristic value. Independently, the charge and the voltage of the piezoelectric actuator is detected and the measured capacitance characteristic value is determined on the basis of these. The piezoelectric temperature value is determined by the measured capacitance characteristic value and the first correction capacitance characteristic value through inverse mapping with respect to the temperature and the capacitance characteristic value.

10 Claims, 4 Drawing Sheets

METHOD AND DEVICE FOR CONTROLLING AN INTERNAL COMBUSTION ENGINE

CROSS-REFERENCE TO RELATED APPLICATIONS

This application claims priority to German Patent Application Number 10 2007 011 693.6 filed on Mar. 9, 2007, and which is incorporated herein by reference in its entirety.

TECHNICAL FIELD

The invention relates to a method and a device for controlling an internal combustion engine with an actuating device that includes a piezoelectric actuator.

BACKGROUND

Increasingly stringent legal requirements with regard to the permissible pollutant emissions of internal combustion engines installed in automobiles make it necessary to take various measures by which the pollutant emissions are reduced. Here a starting point is to reduce the pollutant emissions produced during the combustion process of the air/fuel mixture.

In order to achieve very good mixture preparation, fuel is increasingly metered under very high pressure. In the case of diesel combustion engines the fuel pressures are up to 2000 bar, for example. In the case of gasoline combustion engines the fuel pressures are up to approximately 200 bar. Injection valves having a piezoelectric actuator as the actuating mechanism are increasingly gaining acceptance for such applications. Piezoelectric actuators are distinguished by very short response times. Where applicable, such injection valves are therefore designed to meter fuel several times within one combustion cycle of a cylinder of the internal combustion engine.

A particularly good mixture preparation can be obtained if one or several pre-injections, also termed pilot injections, take place before a main injection, it being possible, if required, for a very small amount of fuel to be metered for the individual pre-injection. For these cases in particular, precise control of the injection valves is very important.

It is known from DE 196 52 807 A1 that in order to control a piezoelectrically operated fuel injection valve, in one control cycle of the actuator the charge of a capacitor that is charged up to the specified voltage is at least partially transmitted to the actuator during a specified charging time. Furthermore, the charging time of the following control cycle is varied by an absolute value stored in an area of an engine operating map assigned to this charging time and to the charging voltage of the actuator obtained in this charging time.

It is known from DE 100 63 080 A1 that the functional relationship between the electrical energy applied to the actuator and the actuator stroke is also temperature-dependent and that the temperature is to be taken into account during the control of the actuator. For this, the actuator controller has three temperature sensors which measure the cooling water temperature, the oil temperature and the fuel temperature and relays these to an evaluation unit which derives the actuator temperature therefrom. A characteristic unit inputs to a driver circuit a setpoint for the electrical charge to be applied to the actuator, on the basis of the actuator temperature, so that a constant stroke is set irrespective of the actuator temperature.

SUMMARY

According to an embodiment, a method for operating an internal combustion engine with an actuating device that includes a piezoelectric actuator, a temperature sensor, that detects a temperature outside the actuating device, a charge sensor, whose measuring signal is representative of an electrical charge which is applied to the piezoelectric actuator, and a voltage sensor, whose measuring signal is representative of an electrical voltage that is dropped across the piezoelectric actuator, may comprise the steps of: —when a specified first condition is met, which is met at the earliest after a time period that exceeds a specified engine stop period, —detecting a measuring signal of the temperature sensor and a piezoelectric temperature value on the basis of the measuring signal of the temperature sensor, —determining a temperature-capacitance characteristic value of the piezoelectric actuator by means of a specified mapping on the basis of the piezoelectric temperature value, —determining a measured capacitance characteristic value by means of a detected charge value and a voltage value corresponding to the measuring signal of the temperature sensor of the piezoelectric actuator, —determining a first correction capacitance characteristic on the basis of the measured capacitance characteristic value and the temperature-capacitance characteristic value, —independently of the specified first condition—detecting the charge value and the voltage value of the piezoelectric actuator and depending on the detected charge and voltage value, determining the measured capacitance characteristic value, —determining the piezoelectric temperature value on the basis of the measured capacitance characteristic value and the first correction capacitance characteristic value by means of the inverse mapping with respect to the temperature and the capacitance characteristic value.

According to another embodiment, a device for operating an internal combustion engine may comprise an actuating device that contains a piezoelectric actuator, a temperature sensor, that detects a temperature outside the actuating device, a charge sensor, whose measuring signal is representative of an electrical charge which is applied to the piezoelectric actuator, and a voltage sensor, whose measuring signal is representative of an electrical voltage that is dropped across the piezoelectric actuator, the device being operable: —on fulfillment of a specified first condition, that is fulfilled at the earliest after a time period that exceeds a specified engine stop period, —to detect a measuring signal of the temperature sensor and to determine a piezoelectric temperature value on the basis of the measuring signal of the temperature sensor, —to determine a temperature-capacitance characteristic value of the piezoelectric actuator by means of a specified mapping, on the basis of the piezoelectric temperature value, —to determine a measured capacitance characteristic value by means of a detected charge value and a voltage value of the piezoelectric actuator corresponding to the measuring signal of the temperature sensor, —to determine a first correction capacitance characteristic value on the basis of the measured capacitance characteristic value and the temperature-capacitance characteristic value, —independently of the specified first condition—to detect the charge value and the voltage value of the piezoelectric actuator and on the basis of these, to determine the measured capacitance characteristic value, and—to determine the piezoelectric temperature value on the basis of the measured capacitance characteristic value and the first correction capacitance characteristic value by means of the inverse mapping with respect to the temperature and the capacitance characteristic value.

According to a further embodiment, —the fulfillment of the specified first condition may require that the piezoelectric temperature value be less than a specified first threshold value, —on fulfillment of a specified second condition whose fulfillment depends on whether a temperature, determined on the basis of the measuring signal of the temperature sensor, exceeds a second specified threshold, —the measuring signal of the temperature sensor is detected and the piezoelectric temperature value is determined on the basis of the measuring signal, —a temperature-capacitance characteristic value of the piezoelectric actuator is determined by means of the specified mapping on the basis of the piezoelectric temperature value, —the measured capacitance characteristic value is determined by means of the detected charge value and the voltage value of the piezoelectric actuator corresponding to the measuring signal of the temperature sensor, and—a second correction capacitance characteristic value is determined on the basis of the measured capacitance characteristic value and the temperature-capacitance characteristic value and the first correction capacitance characteristic value, —independently of the specified second condition—the charge value and the voltage value of the piezoelectric actuator are detected and the measured capacitance characteristic value is determined on the basis of these, and—the piezoelectric temperature value is determined on the basis of the measured capacitance characteristic value and the first and second correction capacitance characteristic value, by means of the inverse mapping with respect to the temperature and the capacitance characteristic value. According to a further embodiment, the fulfillment of the second condition further may require that the internal combustion engine be operated in a partial load or idling operating condition. According to a further embodiment, the fulfillment of the second condition further may require that the internal combustion engine has adopted the partial load or the idling operating condition, at least continuously for a specified operating period. According to a further embodiment, —the fulfillment of the specified first condition may require that the piezoelectric temperature value be less than a specified first threshold value, —on the fulfillment of a specified third condition whose fulfillment requires that the internal combustion engine be started within a specified engine stop interval and that a temperature determined on the basis of the measuring signal of the temperature sensor exceeds a specified third threshold value, —the measuring signal of the temperature sensor is detected and the piezoelectric temperature value is determined on the basis of the measuring signal, —on the basis of the piezoelectric temperature value, a temperature-capacitance characteristic value of the piezoelectric actuator is determined by means of the specified mapping, —the measured capacitance characteristic value is determined by means of the detected charge value and the voltage value of the piezoelectric actuator corresponding to the measuring signal of the temperature sensor, and—a second correction capacitance characteristic value is determined on the basis of the measured capacitance characteristic value and the temperature-capacitance characteristic value and the first correction capacitance characteristic value, —independently of the specified third condition—the charge value and the voltage value of the piezoelectric actuator are detected and the measured capacitance characteristic value is determined on the basis of these, and—the piezoelectric temperature value is determined on the basis of the measured capacitance characteristic value and the first and second correction capacitance characteristic value by means of the inverse mapping with respect to the temperature and the capacitance characteristic value.

BRIEF DESCRIPTION OF THE DRAWINGS

Exemplary embodiments of the invention are explained in detail below with the aid of the schematic drawings, in which.

In the figures, elements having the same construction or function are denoted by identical reference numbers.

DETAILED DESCRIPTION

Figure 1:
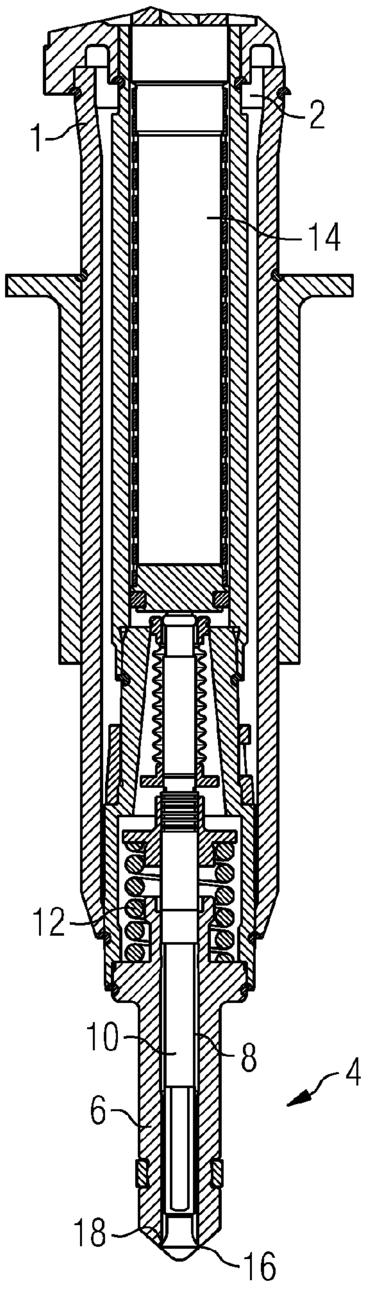
FIG. 1 shows an actuating device.

According to various embodiments of a method and a corresponding device for operating an internal combustion engine, an actuating device includes a piezoelectric actuator. Furthermore, a temperature sensor that detects a temperature outside the actuating device is assigned to the internal combustion engine. Furthermore, a charge sensor is provided, whose measuring signal is representative of an electrical charge which is applied to the piezoelectric actuator. In addition, a voltage sensor is provided, whose measuring signal is representative of an electrical voltage that is dropped across the piezoelectric actuator. The following steps are carried out when a first, specified condition is met, that is to say met at the earliest after a time period that exceeds a specified engine stop period: A measuring signal of the temperature sensor is detected and a piezoelectric temperature value is determined on the basis of the measuring signal of the temperature sensor. On the basis of the piezoelectric temperature value, a temperature-capacitance characteristic value of the piezoelectric actuator is determined by means of a specified engine operating map. A measured capacitance characteristic value is determined by means of a detected charge value and a voltage value of the piezoelectric actuator corresponding to the measuring signal of the temperature sensor. A first correction-capacitance characteristic value is determined on the basis of the measured capacitance characteristic value and the temperature-capacitance characteristic value.

The following steps are carried out independently of the specified, first condition. The charge value and voltage value of the piezoelectric actuator are detected and the measured capacitance characteristic value is determined on the basis of these. On the basis of the measured capacitance characteristic value and the first correction capacitance characteristic value, the piezoelectric temperature value is determined by means of the inverse engine operating map with respect to the temperature and the capacitance characteristic value.

This procedure thus enables the piezoelectric temperatures to be determined very accurately without having to install a special temperature sensor so that it directly detects the piezoelectric temperature at the piezoelectric actuator. In addition, the mapping and also the inverse mapping can be determined for an entire class of piezoelectric actuators and individual deviations in the characteristic of the respective piezoelectric actuator can be taken into account very accurately by means of the first correction capacitor characteristic value.

Moreover, with an appropriately specified engine stop period, the piezoelectric temperature value can be determined very accurately by means of the temperature sensor's measuring signal, which detects the temperature outside the actuating device, and consequently this piezoelectric temperature value can be simply used as a reference value to determine the first correction value.

According to an embodiment, the fulfillment of the specified first condition requires that the piezoelectric temperature value be less than a specified first threshold value. Furthermore, fulfillment of a specified second condition depends on whether a temperature determined on the basis of the measuring signal of the temperature sensor exceeds a second specified threshold. If the specified second condition is met, the measuring signal of the temperature sensor is detected and the piezoelectric temperature value is determined on the basis of the measuring signal. Furthermore, a temperature-capacitance characteristic value of the piezoelectric actuator is determined on the basis of the piezoelectric temperature value by means of the specified mapping. In addition, the measured capacitance characteristic value is determined by means of the detected charge value and voltage value of the piezoelectric actuator corresponding to the measuring signal of the temperature sensor. Finally, a second correction-capacitance characteristic value is determined on the basis of the measured capacitance characteristic value, the temperature-capacitance characteristic value and the first correction-capacitance characteristic value.

Independently of the specified second condition, the charge value and voltage value of the piezoelectric actuator are detected and the measured capacitance characteristic value determined on the basis of this. The piezoelectric temperature value is determined on the basis of the measured capacitance characteristic value and the first and second correction value, by means of the inverse mapping with respect to the temperature and capacitance characteristic value.

Individual deviations in the respective piezoelectric actuator can be even more accurately compensated in this way, and in particular in a linear manner. For this purpose, in particular, an adaptation of mapping values of the inverse mapping can be implemented on the basis of the second and, if necessary, the first correction capacitance characteristic value.

In this connection it is advantageous if the fulfillment of the second condition further requires that the internal combustion engine be operated in a partial load or idling condition. In these operating conditions the correlation between the measuring signal of the temperature sensor and the piezoelectric temperature value is usually high. In this connection the correlation is then especially high if the temperature sensor detects the temperature of the internal combustion engine's coolant.

According to a further embodiment, the fulfillment of the second condition further requires that the internal combustion engine has adopted the partial load or idling condition, at least continuously for a specified operating period. In this case a particularly high correlation can be assured between the measuring signal of the temperature sensor and the piezoelectric temperature.

Furthermore, it is advantageous if the specified operating period is at least approximately 5 minutes. A particularly high correlation between the measuring signal of the temperature sensor and the piezoelectric temperature can also be guaranteed in this way.

According to a further embodiment, the fulfillment of the specified first condition requires that the piezoelectric temperature value be less than a specified first threshold. Furthermore, fulfillment of a specified third condition requires that the internal combustion engine be started within a specified engine stop interval and that a temperature determined in accordance with the measuring signal of the temperature sensor exceeds a specified third threshold.

If the specified third condition is met, the measuring signal of the temperature sensor is detected and determined on the basis of the measuring signal of the piezoelectric temperature value. Furthermore, a temperature-capacitance characteristic value of the piezoelectric actuator is determined by means of the specified mapping on the basis of the piezoelectric temperature value. In addition, the measured capacitance characteristic value is determined by means of the detected charge value and voltage value of the piezoelectric actuator corresponding to the measuring signal of the temperature sensor. Finally, the second correction-capacitance characteristic value is determined on the basis of the measured capacitance characteristic value, the temperature-capacitance characteristic value and the first correction-capacitance characteristic value.

Independently of the specified third condition, the charge value and the voltage value of the piezoelectric actuator is detected and the measured capacitance characteristic value determined on the basis of this. Finally, on the basis of the measured capacitance characteristic value and the first and second correction capacitance characteristic value, the piezoelectric temperature value is determined by means of the inverse mapping with respect to the temperature characteristic value and the capacitance characteristic value.

As a result, the second correction capacitance characteristic value can be easily and accurately determined since a particularly high correlation between the measuring signal of the temperature sensor and the piezoelectric temperature is assured by means of an appropriate input of the engine stop time interval.

An actuating device includes an actuating mechanism that is designed as a piezoelectric actuator 14 (FIG. 1). For example, the actuating device can be designed as an injection valve for metering fuel into a combustion chamber of a cylinder of an internal combustion engine. However, the actuating device can be designed for any other purpose, and used for example to meter a fluid other than fuel in the context of an internal combustion engine. In principle, the actuating device can be any type of actuating device that can be provided for an internal combustion engine.

The actuating device includes a housing 1, into which a fluid supply 2 is introduced. When operated in the conventional way as an injection valve the actuating device is hydraulically coupled to a fuel supply system which, in particular, supplies the fuel under very high pressure.

Furthermore, a valve body 4 is provided, to which a sleeve body 6 is assigned. A valve body recess 8 is provided, into which a nozzle pin 10 is introduced. A return spring 12 is provided, which is arranged so that in the absence of the effects of other forces, the nozzle needle 10 is pressed into a seat 18 of a nozzle 16 and consequently the nozzle needle 10 is subjected to a force in such a way that it is in its closed position. In its closed position the nozzle needle 10 prevents fuel from being metered through the nozzle 16. Outside its closed position said nozzle needle opens the nozzle 16 and thus allows metering of fuel through the nozzle 16.

Figure 2:
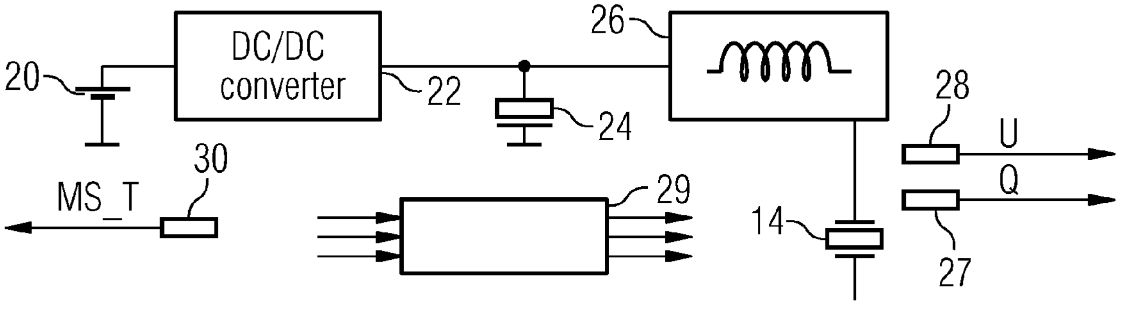
FIG. 2 shows an arrangement with the actuating device in an internal combustion engine.

The nozzle needle 10 forms a final controlling element of the actuating device. The nozzle needle is assigned to the piezoelectric actuator 14, which contains a stack of piezoelectric elements and can be electrically coupled to a power output stage unit 26 (FIG. 2).

On the basis of the electrical energy supplied to it, the piezoelectric actuator 14 exerts a varying force on the nozzle needle 10 and thus decisively determines its position.

The power output stage unit is designed to apply a charging current to the piezoelectric actuator 14 in order to supply or draw electrical energy. The power output stage unit 26 can also be assigned to a plurality of, and thus further, piezoelectric actuators 14, which are, for example, assigned to different cylinders of the internal combustion engine.

A voltage amplifier 22, that can also be described as a DC/DC converter, is electrically coupled to a vehicle's electrical system which is designed to supply the voltage amplifier 22 with a specified voltage and so forms a voltage source. The vehicle's electrical system includes a vehicle battery, for example. The voltage amplifier 22 is electrically coupled to the power output stage 26. A capacitor 24 can be preferably interposed in such a way that electrical energy is temporarily stored in the capacitor 24 during a discharge cycle of the respective piezoelectric actuator 14, and can be used for future charging cycles. The power output stage 26 contains, in particular, an inductor which when coupled to the piezoelectric actuator 14 forms an oscillating circuit and on the other hand via the capacitor 24 also forms a supply-system oscillating circuit at the input end.

The power output stage 26 includes switching means, by which a charging current for the piezoelectric actuator 14 is limited to a current threshold that is input to the power output stage 26. For this, the value of the charging current can be appropriately set during a charge or discharge cycle in the manner of a two-step control. The power output stage 26 can also contain a timing element by means of which the charging current can be returned to a zero value on expiration of a specified time period.

Furthermore, a charge sensor 27 is provided, which detects a charge value Q of a charge that was fed to the piezoelectric actuator 14, that is to say during a charging cycle, for example.

Furthermore, a voltage sensor 28 is provided, which detects the voltage appearing at the piezoelectric actuator, in particular at the end of the respective charging cycle, and which consequently detects a voltage value U.

A control device 29 is provided, which is designed to apply actuating signals to the power output stage 26 and thus control the respective charging or discharging sequence of the piezoelectric actuator 14. Sensors that detect the various measured variables are assigned to the control device 29. Besides the measured variables, operating variables also include variables derived from said measured variables.

The control device 29 is designed to determine manipulated variables on the basis of at least one of the operating variables, which are then converted into one or more actuating signals for controlling the internal combustion engine's actuating devices. The control device 29 can also be described as a device for operating the internal combustion engine.

Apart from the charge sensor 27 and the voltage sensor 28, the sensors include a temperature sensor 30, which detects a temperature outside the actuating device. The temperature sensor can for example, be arranged so that it detects the temperature of the internal combustion engine's coolant. However, it can also be arranged so that it detects a fuel temperature or induction-air temperature, for example.

Other sensors can be assigned to the control device 29, such as a pedal position transmitter which detects a gas pedal position of a gas pedal, and/or an air mass sensor which detects an air mass flow upstream of a throttle valve, and/or an induction manifold pressure sensor which detects an induction manifold pressure in a manifold, and/or a crankshaft angle sensor which detects a crankshaft angle to which a rotational speed is then assigned, and/or a fuel sensor which detects a fuel pressure in a fuel supply system.

The control device 29 includes a memory which is designed to store programs and data, plus a processing unit into which the programs can be loaded and executed at that location during the operation of the internal combustion engine.

A flow chart of a first program is explained in detail below with the aid of FIG. 3. The program is started in step S1, during engine standstill, for example, that is to say when the internal combustion engine is turned off and therefore not actively operated. However, the program can for example also be started in advance of the start-up of the internal combustion engine. If necessary, variables can be initialized in step S1.

In step S2 a check is made as to whether a time interval TD exceeds a specified engine stop time interval T_ENG_OFF since the engine was stopped, that is to say if the internal combustion engine has not been restarted in the meantime. The specified engine stop time interval T_ENG_OFF can amount to approximately 8 to 10 hours, say 8 hours for example. If the condition of step S2 is not met, then the program is ended in step S4.

If, on the other hand, the condition of step S2 is met, then a piezoelectric temperature value T_P is determined in step S6 on the basis of a measuring signal MS_T of the temperature sensor 30. A specified temperature sensor characteristic can be used in the course of this. In principle, the temperature sensor 30 can be arranged to directly and indirectly detect various temperatures in the internal combustion engine. Accordingly, the temperature sensor 30 can also include a plurality of temperature sensors, such as a temperature sensor for detecting the coolant temperature and the fuel temperature, and, appropriately, their measuring signals MS_T are used in combination to determine the piezoelectric temperature value T_P. The piezoelectric temperature value T_P represents the temperature of the piezoelectric actuator 14.

By providing the condition of step S2, which may also be termed the first condition, a high correlation can be assured between the piezoelectric temperature value T_P, determined by means of the measuring signal MS_T of the temperature sensor 30, and the actual temperature of the piezoelectric actuator 14.

In step S8 a fuel pressure FUP is determined by means of the fuel pressure sensor. Preferably in this case the fuel pressure can be correlated to that fuel pressure which is acting on the final controlling element assigned to the piezoelectric actuator.

A temperature-capacitance characteristic value C_T of the piezoelectric actuator 14 is determined in step S10, that is to say by means of a specified mapping KF, on the basis of the piezoelectric temperature value T_P and preferably on the basis of the fuel pressure FUP.

The mapping KF can be preferably determined empirically, that is to say for a large number of basically similar piezoelectric actuators, but whose individual characteristics can be slightly different. In particular, this can be due to production batch variation and manufacturing tolerances and also on the basis of influencing variables such as a period of operation since the piezoelectric actuator 14 was put into service for the first time.

A charge value Q and voltage value U are detected in step S12, it being possible for this to occur more or less at the same time as the detection of the measuring signal MS_T of the temperature sensor 30 in step S6, assuming that the actual temperature of the piezoelectric actuator 14 has not changed or only slightly so. A measured capacitance characteristic value C_MEAS is determined on the basis of the charge value Q and the voltage value U, and preferably by dividing the charge value Q by the voltage value U.

On the basis of the measured capacitance characteristic value C_MEAS and the temperature-capacitance characteristic value C_T, a first correction-capacitance characteristic value COR1 is then determined in step S14. Preferably, the first correction-capacitance characteristic value COR1, also termed the linear intercept value or offset, can be determined and can thus be simply determined by means of a difference between the measured capacitance characteristic value C_MEAS and the temperature-capacitance characteristic value C_T. Processing is then continued in step S4.

In step S14, an adaptation of a first correction-capacitance characteristic value COR1 already determined in a previous pass through step S14 can also be carried out, that is for example by means of suitable filtering such as the generation of a running average, for example.

Figure 4:
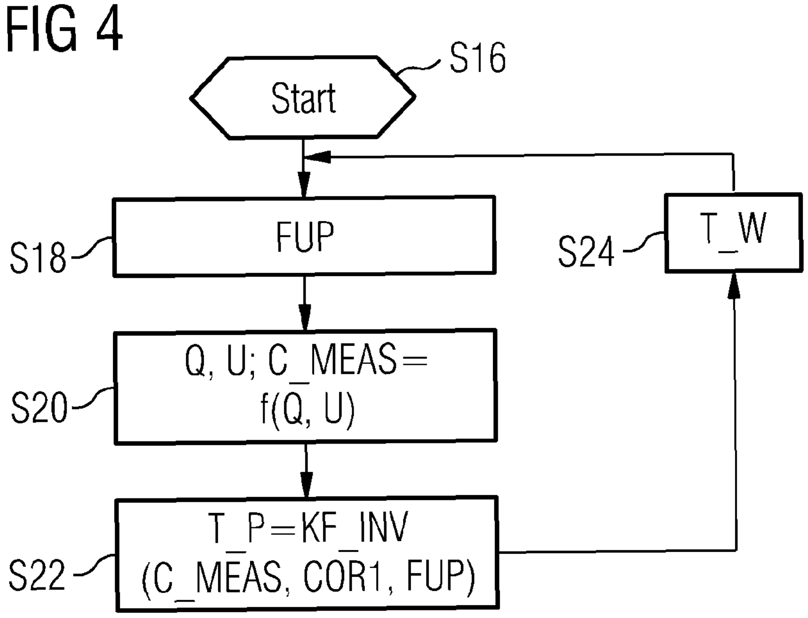
FIG. 4 shows a second flowchart of a further program.

FIG. 4 shows a further flow chart of a second program which in principle can be processed in the control device 29 independently of the first program. The program is started in step S16 in which variables can also be initialized if required. The fuel pressure FUP is detected in step S18. The charge value Q and the assigned voltage value U are detected in step S20 and the measured capacitance characteristic value C_MEAS determined from said voltage value.

A piezoelectric temperature value T_P is then determined in step S22. This is achieved by means of an inverse mapping KF_INV of the mapping KF, which is the inverse of the temperature and of the capacitance characteristic value, that is to say on the basis of the measured capacitanc characteristic value C_MEAS, the first correction capacitance characteristic value COR1 and the fuel pressure FUP. In this connection, one of the input variables of the inverse mapping KF_INV of the measured capacitance characteristic value C_MEAS minus the first correction value COR1, may be preferred. Consequently, a very accurate piezoelectric temperature value T_P can be determined in this way, even in an operating state of the internal combustion engine, in which the measuring signal MS_T of the temperature sensor 30 is not or only poorly correlated to the actual temperature of the piezoelectric actuator 14.

Following step S22, processing is continued in step S24, in which the program pauses for a specified waiting time T_W, before processing is again continued in step S18.

A third program (FIG. 5) is started in step S26. The third program corresponds to some extent to the first program as shown in FIG. 3. The differences between the two programs, in particular, are explained in detail below.

In step S28, in addition to S2, a check is made as to whether a temperature TX, that is determined on the basis of the temperature sensor 30, and which can be the coolant temperature, for example, is less than a specified first threshold value THD1. The first threshold value THD1 can, for example, be between 10 and approximately 20 or 30° C., say 10° for example. If the condition of step S28 is met, which in this respect also represents the first condition, then steps S30 to S38, which correspond to steps S6 to S14, are executed. Step S40 corresponds to step S4.

On the other hand, if the condition of step S28 is not met, then processing is continued in step S42.

A check is made in step S42 as to whether the current operating state ES of the internal combustion engine is the idling state IS or the partial load state PL. Furthermore, an additional check is made as to whether the time period TD since the current operating state ES was adopted, exceeds a specified operating time period TB.

Furthermore, an additional check can be preferably made as to whether the temperature TX, which is determined on the basis of the measuring signal MS_T of the temperature sensor 30, which likewise can be the coolant temperature as in step S28, for example, exceeds a specified second threshold value THD2, that is 60° C., for example.

If the overall condition of step S42, which can also be described as the second condition, is not met, then processing is continued in step S40. If, on the other hand, the overall condition of step S42 is met, then in step S44 the piezoelectric temperature value T_P is determined on the basis of the measuring signal MS_T of the temperature sensor 30. In this connection, the knowledge is used that with a suitably specified operating time period TB, the second condition can ensure that a very high correlation is obtained between the measuring signal MS_T of the temperature sensor 30 and the actual piezoelectric temperature of the piezoelectric actuator 14.

The fuel pressure FUP is determined in step S46 and then, on the basis of the fuel pressure and the piezoelectric temperature value T_P, the temperature-capacitance characteristic value C_T is determined by means of the mapping KF in step S48 corresponding to step S34. Charge values Q and voltage values U, which are detected promptly so that they correlate to the piezoelectric temperature value T_P derived from the measuring signal MS_T in step S44, are detected in step S40. Furthermore, on the basis of the charge value Q and the voltage value U, a measured capacitance characteristic value C_MEAS is determined in step S50.

On the basis of the measured capacitance characteristic value C_MEAS, the temperature-capacitance characteristic value C_T and the first correction capacitance characteristic value COR1, a second correction capacitance characteristic value COR2 is then determined in step S52. In this connection, the second correction capacitance characteristic value COR2 can be determined, for example, so that it is linearly on the basis of the measured capacitance characteristic value C_MEAS or if necessary, on the measured capacitance characteristic value C_MEAS corrected by means of the first correction value COR1. The second correction capacitance characteristic value COR2 can implement a gradient correction in this way.

Following step S52, processing is continued in step S40.

Figure 6:
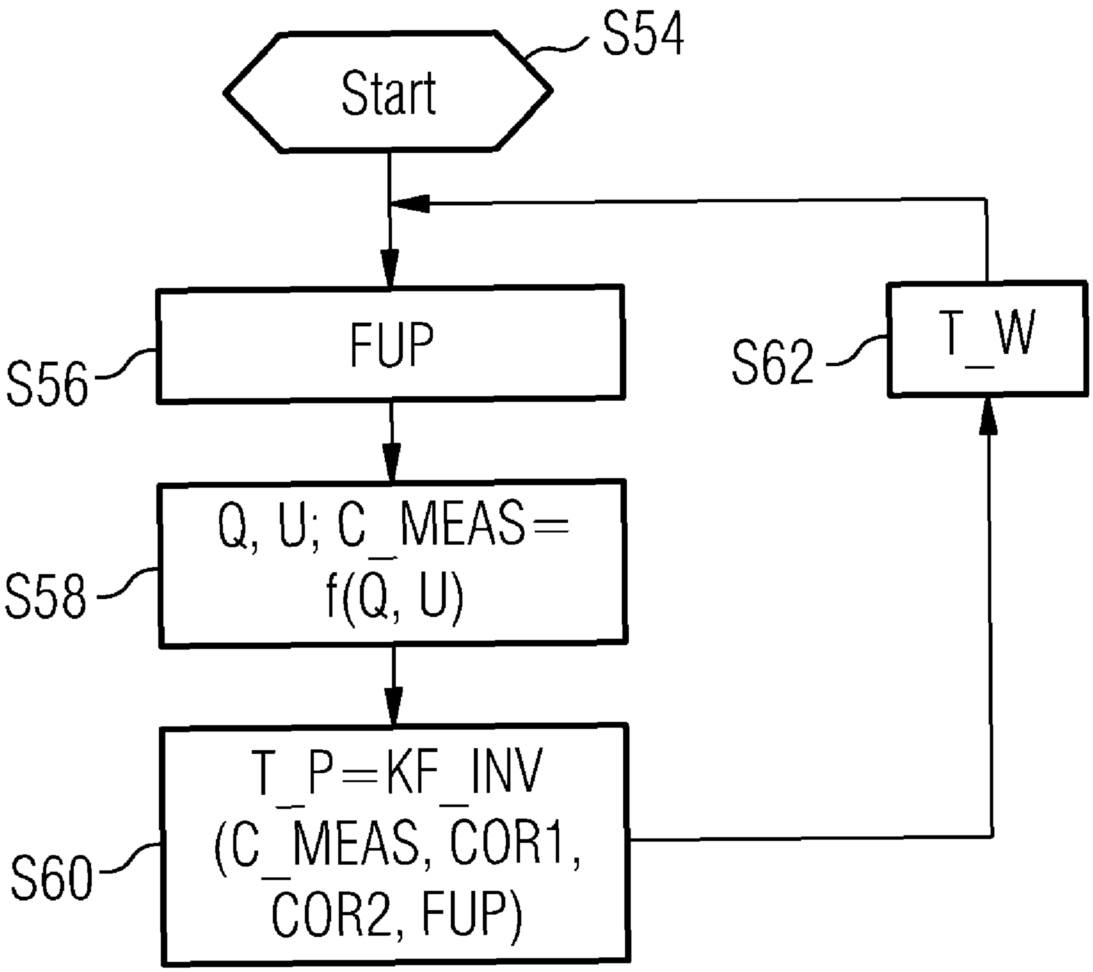
FIG. 6 shows a further flowchart of a further program.

A flow chart of a fourth program, whose differences compared to the one shown in FIG. 4 are explained below, is described with the aid of FIG. 6.

The program is started in step S54. Steps S56 and S58 correspond to steps S18 and S20. Step S60 differs from step S22 inasmuch as the second correction capacitance characteristic value COR2 is also taken into account when determining the piezoelectric temperature value T_P. For this, the inverse mapping KF_INV can be suitably adapted on the basis of the gradient relationship determined in step S52, for example, and alternately, however, at the input end of the inverse mapping KF_INV, the measured capacitance characteristic value C_MEAS can be taken into account on the basis of the first correction capacitance characteristic value COR1 and the second correction capacitance characteristic value COR2, that is to say, in particular, taking the measured capacitance characteristic value C_MEAS into account.

Step S62 corresponds to step S24.

Alternately or in conjunction with step S42 (FIG. 5) step S42' can be provided, in which a check is made as to whether the internal combustion engine is started within a specified engine stop interval T_ENG_OFF_INT and whether the temperature TX, determined on the basis of the measuring signal MS_T of the temperature sensor 30, which represents the coolant temperature, for example, exceeds a specified third threshold value THD3. The engine stop interval T_ENG_OFF_INT can be determined empirically so that a high correlation exists between the temperature TX determined on the basis of the measuring signal MS_T of the temperature sensor 30 and the actual temperature of the piezoelectric actuator. It is particularly favourable if the engine stop interval T_ENG_OFF_INT can be, for example, within approximately 0.5 to approximately 3 hours after the engine has stopped.

The specified third threshold value THD3 can be made the same as the second threshold value THD2. However, it can also differ from said second threshold value.

If the condition of step S42', which is denoted as the third condition, is met then processing is continued in step S44 or otherwise the program is ended in step S40.

Figure 3:
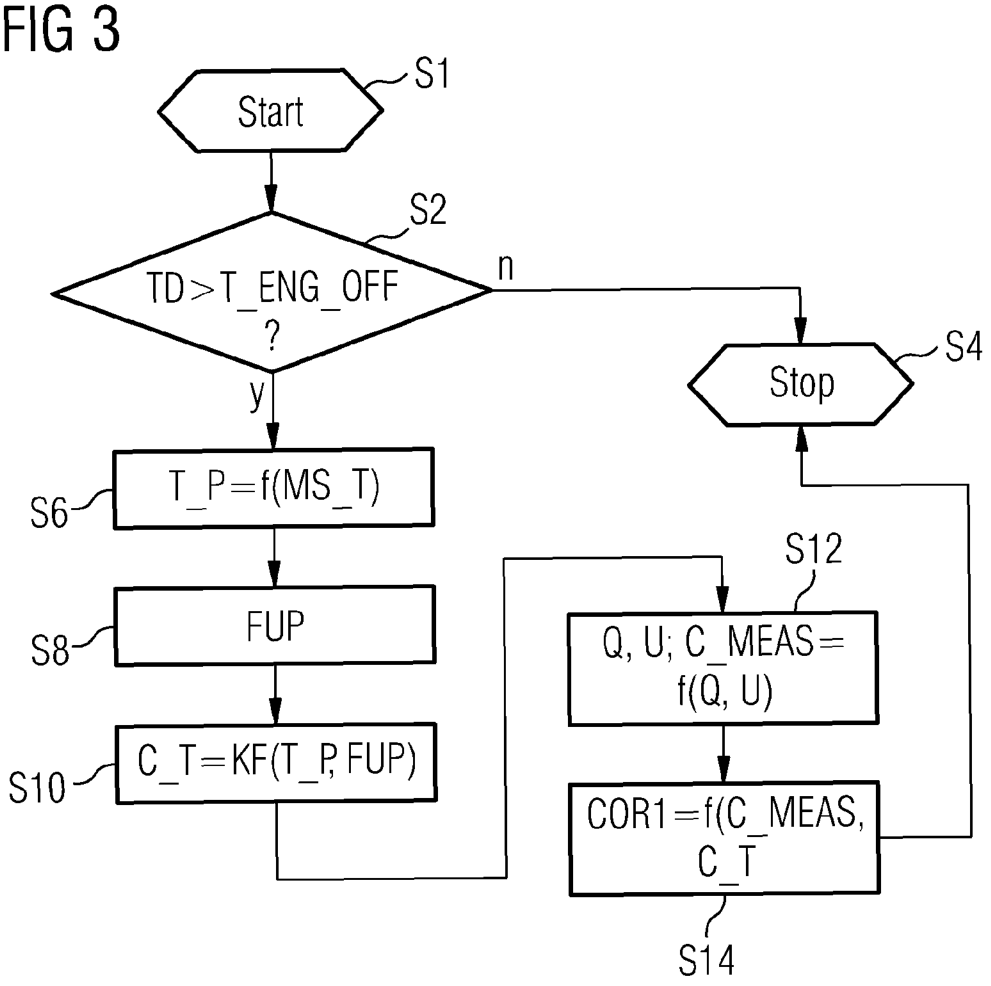
FIG. 3 shows a first flowchart of a program.
Figure 5:
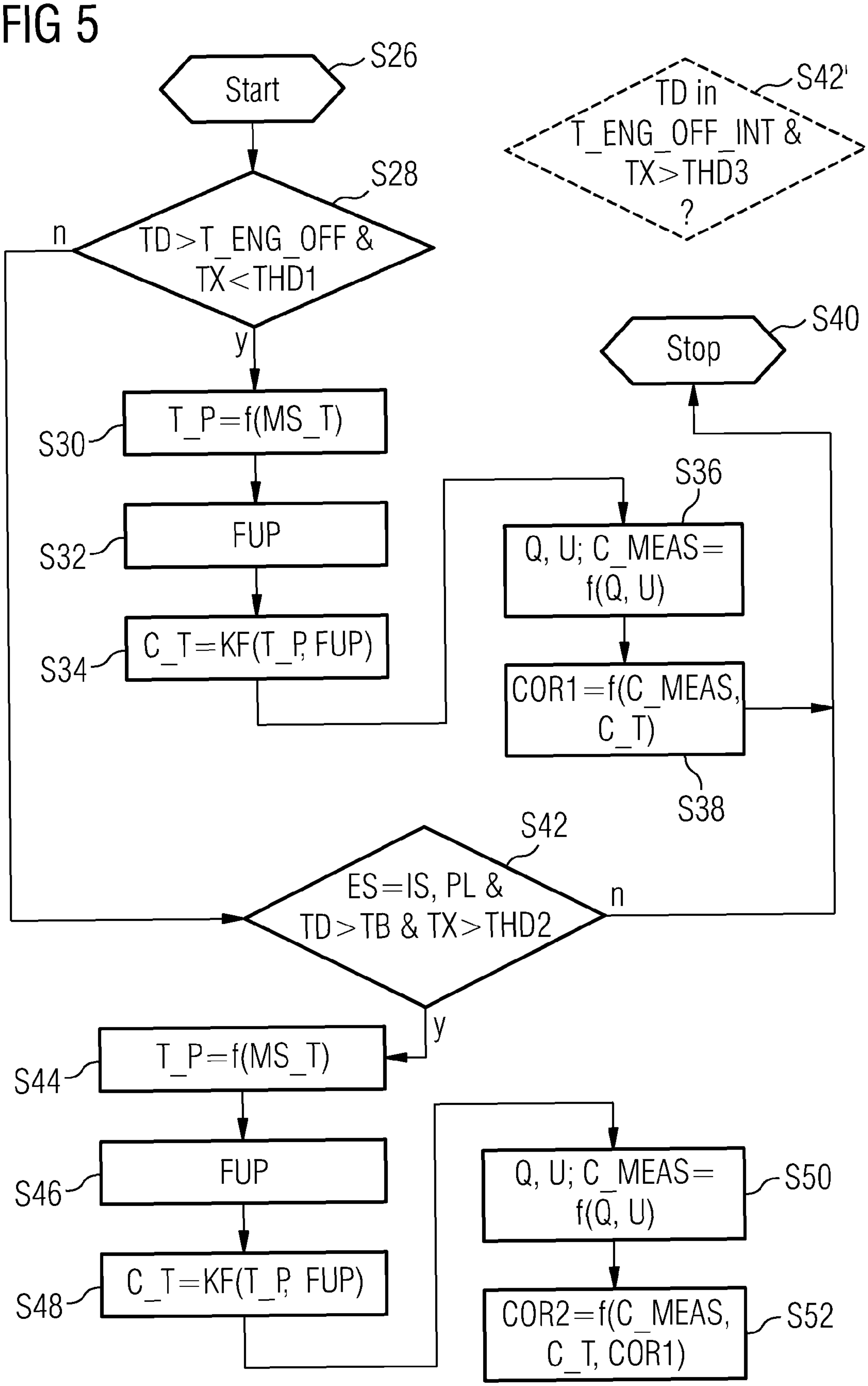
FIG. 5 shows a further flowchart of a further program.

Furthermore, on the initial commissioning of the internal combustion engine, which preferably may take place on completion of its installation in an automobile, the program is executed at step S6 or S30 immediately following step S1 or S26, respectively, as shown in FIG. 3 or 5. The result of this is that the first correction capacitance characteristic value COR1 is at any rate already determined.

What is claimed is:

1. A method for operating an internal combustion engine with an actuating device that includes a piezoelectric actuator, and a temperature sensor, that detects a temperature outside the actuating device, and a charge sensor, whose measuring signal is representative of an electrical charge which is applied to the piezoelectric actuator, and a voltage sensor, whose measuring signal is representative of an electrical voltage that is dropped across the piezoelectric actuator, the method comprising the steps of:

when a specified first condition is met, which is met at the earliest after a time period that exceeds a specified engine stop period, detecting a measuring signal of the temperature sensor and a piezoelectric temperature value on the basis of the measuring signal of the temperature sensor, determining a temperature-capacitance characteristic value of the piezoelectric actuator by means of a specified mapping on the basis of the piezoelectric temperature value, determining a measured capacitance characteristic value by means of a detected charge value and a voltage value corresponding to the measuring signal of the temperature sensor of the piezoelectric actuator, determining a first correction capacitance characteristic on the basis of the measured capacitance characteristic value and the temperature-capacitance characteristic value, independently of the specified first condition detecting the charge value and the voltage value of the piezoelectric actuator and depending on the detected charge and voltage value, determining the measured capacitance characteristic value, determining the piezoelectric temperature value on the basis of the measured capacitance characteristic value and the first correction capacitance characteristic value by means of the inverse mapping with respect to the temperature and the capacitance characteristic value.

2. The method according to claim 1, wherein the fulfillment of the specified first condition requires that the piezoelectric temperature value be less than a specified first threshold value, on fulfillment of a specified second condition whose fulfillment depends on whether a temperature, determined on the basis of the measuring signal of the temperature sensor, exceeds a second specified threshold, the measuring signal of the temperature sensor is detected and the piezoelectric temperature value is determined on the basis of the measuring signal, a temperature-capacitance characteristic value of the piezoelectric actuator is determined by means of the specified mapping on the basis of the piezoelectric temperature value, the measured capacitance characteristic value is determined by means of the detected charge value and the voltage value of the piezoelectric actuator corresponding to the measuring signal of the temperature sensor, und a second correction capacitance characteristic value is determined on the basis of the measured capacitance characteristic value and the temperature-capacitance characteristic value and the first correction capacitance characteristic value, independently of the specified second condition the charge value and the voltage value of the piezoelectric actuator are detected and the measured capacitance characteristic value is determined on the basis of these, and the piezoelectric temperature value is determined on the basis of the measured capacitance characteristic value and the first and second correction capacitance characteristic value, by means of the inverse mapping with respect to the temperature and the capacitance characteristic value.

3. The method according to claim 2, wherein, the fulfillment of the second condition further requires that the internal combustion engine be operated in a partial load or idling operating condition.

4. The method according to claim 2, wherein the fulfillment of the second condition further requires that the internal combustion engine has adopted the partial load or the idling operating condition, at least continuously for a specified operating period.

5. The method according to claim 1, wherein the fulfillment of the specified first condition requires that the piezoelectric temperature value be less than a specified first threshold value, on the fulfillment of a specified third condition whose fulfillment requires that the internal combustion engine be started within a specified engine stop interval and that a temperature determined on the basis of the measuring signal of the temperature sensor exceeds a specified third threshold value, the measuring signal of the temperature sensor is detected and the piezoelectric temperature value is determined on the basis of the measuring signal, on the basis of the piezoelectric temperature value, a temperature-capacitance characteristic value of the piezoelectric actuator is determined by means of the specified mapping, the measured capacitance characteristic value is determined by means of the detected charge value and the voltage value of the piezoelectric actuator corresponding to the measuring signal of the temperature sensor, and a second correction capacitance characteristic value is determined on the basis of the measured capacitance characteristic value and the temperature-capacitance characteristic value and the first correction capacitance characteristic value, independently of the specified third condition the charge value and the voltage value of the piezoelectric actuator are detected and the measured capacitance characteristic value is determined on the basis of these, and the piezoelectric temperature value is determined on the basis of the measured capacitance characteristic value and the first and second correction capacitance characteristic value by means of the inverse mapping with respect to the temperature and the capacitance characteristic value.

6. A device for operating an internal combustion engine comprising an actuating device that contains a piezoelectric actuator, a temperature sensor, that detects a temperature outside the actuating device, a charge sensor, whose measuring signal is representative of an electrical charge which is applied to the piezoelectric actuator, and a voltage sensor, whose measuring signal is representative of an electrical voltage that is dropped across the piezoelectric actuator, the device being operable:

on fulfillment of a specified first condition, that is fulfilled at the earliest after a time period that exceeds a specified engine stop period, to detect a measuring signal of the temperature sensor and to determine a piezoelectric temperature value on the basis of the measuring signal of the temperature sensor, to determine a temperature-capacitance characteristic value of the piezoelectric actuator by means of a specified mapping, on the basis of the piezoelectric temperature value, to determine a measured capacitance characteristic value by means of a detected charge value and a voltage value of the piezoelectric actuator corresponding to the measuring signal of the temperature sensor, to determine a first correction capacitance characteristic value on the basis of the measured capacitance characteristic value and the temperature-capacitance characteristic value, independently of the specified first condition to detect the charge value and the voltage value of the piezoelectric actuator and on the basis of these, to determine the measured capacitance characteristic value, and to determine the piezoelectric temperature value on the basis of the measured capacitance characteristic value and the first correction capacitance characteristic value by means of the inverse mapping with respect to the temperature and the capacitance characteristic value.

7. The device according to claim 6, wherein the fulfillment of the specified first condition requires that the piezoelectric temperature value be less than a specified first threshold value, on fulfillment of a specified second condition whose fulfillment depends on whether a temperature, determined on the basis of the measuring signal of the temperature sensor, exceeds a second specified threshold, the device is further operable:

to detect the measuring signal of the temperature sensor and to determine the piezoelectric temperature value on the basis of the measuring signal, to determine a temperature-capacitance characteristic value of the piezoelectric actuator by means of the specified mapping on the basis of the piezoelectric temperature value, to determine the measured capacitance characteristic value by means of the detected charge value and the voltage value of the piezoelectric actuator corresponding to the measuring signal of the temperature sensor, und to determine a second correction capacitance characteristic value on the basis of the measured capacitance characteristic value and the temperature-capacitance characteristic value and the first correction capacitance characteristic value, independently of the specified second condition, the device is operable:

to detect the charge value and the voltage value of the piezoelectric actuator and to determine the measured capacitance characteristic value on the basis of these, and to determine the piezoelectric temperature value on the basis of the measured capacitance characteristic value and the first and second correction capacitance characteristic value, by means of the inverse mapping with respect to the temperature and the capacitance characteristic value.

8. The device according to claim 7, wherein, the fulfillment of the second condition further requires that the internal combustion engine be operated in a partial load or idling operating condition.

9. The device according to claim 7, wherein the fulfillment of the second condition further requires that the internal combustion engine has adopted the partial load or the idling operating condition, at least continuously for a specified operating period.

10. The device according to claim 6, wherein the fulfillment of the specified first condition requires that the piezoelectric temperature value be less than a specified first threshold value, on the fulfillment of a specified third condition whose fulfillment requires that the internal combustion engine be started within a specified engine stop interval and that a temperature determined on the basis of the measuring signal of the temperature sensor exceeds a specified third threshold value, the device is operable:

to detect the measuring signal of the temperature sensor and to determine the piezoelectric temperature value on the basis of the measuring signal, to determine, on the basis of the piezoelectric temperature value, a temperature-capacitance characteristic value of the piezoelectric actuator by means of the specified mapping, to determine the measured capacitance characteristic value by means of the detected charge value and the voltage value of the piezoelectric actuator corresponding to the measuring signal of the temperature sensor, and to determine a second correction capacitance characteristic value on the basis of the measured capacitance characteristic value and the temperature-capacitance characteristic value and the first correction capacitance characteristic value, independently of the specified third condition, the device is operable:

to detect the charge value and the voltage value of the piezoelectric actuator and to determine the measured capacitance characteristic value on the basis of these, and to determine the piezoelectric temperature value on the basis of the measured capacitance characteristic value and the first and second correction capacitance characteristic value by means of the inverse mapping with respect to the temperature and the capacitance characteristic value.

* * * * *